United States Patent [19]
Acovic et al.

[11] Patent Number: 5,446,299
[45] Date of Patent: Aug. 29, 1995

[54] SEMICONDUCTOR RANDOM ACCESS MEMORY CELL ON SILICON-ON-INSULATOR WITH DUAL CONTROL GATES

[75] Inventors: Alexandre Acovic, Mohegan Lake; Ben S. Wu, Yorktown Heights, both of N.Y.

[73] Assignee: International Business Machines Corporation, Armonk, N.Y.

[21] Appl. No.: 235,768

[22] Filed: Apr. 29, 1994

[51] Int. Cl.$^6$ .................. H01L 27/115; H01L 29/788
[52] U.S. Cl. ..................................... 257/316; 257/315; 257/321; 365/185
[58] Field of Search .................. 257/315, 316, 321; 365/185

[56] References Cited

U.S. PATENT DOCUMENTS

| | | | |
|---|---|---|---|
| 2,310,970 | 12/1943 | Okazawa | 365/185 |
| 4,297,719 | 10/1981 | Hsu | 257/316 |
| 4,334,347 | 6/1982 | Goldsmith et al. | 29/571 |
| 4,999,313 | 3/1991 | Arikawa et al. | 437/84 |
| 5,055,898 | 10/1991 | Beilstein, Jr. et al. | 357/23.6 |

FOREIGN PATENT DOCUMENTS

| | | | |
|---|---|---|---|
| 61-78169 | 4/1986 | Japan | 257/316 |
| 4-34981 | 2/1992 | Japan | 257/316 |

OTHER PUBLICATIONS

IBM Technical Disclosure Bulletin, vol. 34, No. 6, Nov. 1991, pp. 238-241 "Vaccum-Sealed Silicon-Rich -Oxide EEPROM Cell".

*Primary Examiner*—Jerome Jackson
*Attorney, Agent, or Firm*—Perman & Green

[57] ABSTRACT

A stacked gate memory cell for a memory cell array is disclosed that is constructed on a SOI substrate and contains a second control gate buried underneath the conducting channel of the cell in addition to a first wordline control gate that is disposed over a floating gate changing the voltage on the second control gate will modulate the potential of the floating channel, which allows a specific cell of the array to be selected and the programmed or erased by FN tunneling through the floating gate and channel without disturbing adjacent cells. While reading the information stored in the floating gate, the second control gate can also be used to prevent disturb. The second control gate is in parallel with the bit line and perpendicular with the first word line control gate. The floating gate and the cell is located at the cross point of the first and second control gates. Therefore, by varying the voltage on the first and second control gates only, the cell can be programmed or erased through FN tunneling.

3 Claims, 5 Drawing Sheets

SEMICONDUCTOR RANDOM ACCESS MEMORY CELL ON SILICON-ON-INSULATOR WITH DUAL CONTROL GATES

FIELD OF THE INVENTION

The present invention relates generally to semiconductor random access memory cell structure and fabrication methods therefor, and more particularly to a non-volatile random access memory cell having dual control gates and fabricated on a silicon-on-insulator structure.

BACKGROUND OF THE INVENTION

Semiconductor memory cells have been fabricated with Fowler-Nordheim tunneling for program and erase functions, and which are used as erasable programmable random access memory cells (EPROM), electrically erasable programmable memory cells (EEPROM) and flash memories.

U.S. Pat. No. 5,055,898 issued Oct. 8, 1991 to Beilstein, Jr. et al. entitled DRAM MEMORY CELL HAVING A HORIZONTAL SOI TRANSFER DEVICE DISPOSED OVER A BURIED STORAGE NODE AND FABRICATION METHODS THEREFOR discloses semiconductor memory cell, and methods of fabricating same, that includes a substrate and a plurality of trench capacitors formed at least partially within the substrate and dielectrically isolated therefrom. A silicon-on-insulator (SOI) region includes a silicon layer that overlies an insulator. The silicon layer is differentiated into a plurality of active device regions, each of which is disposed above one of the electrically conductive regions. Each of the active device regions is coupled to an overlying first electrode, or wordline, for forming a gate node of an access transistor to a second electrode, or bitline, for forming a source node of the access transistor, and to the underlying trench capacitor for forming a drain node of the access transistor. The wordline includes a pair of opposed, electrically insulating vertical sidewalls, and the source node and the drain node of each of the access transistors are each comprised of an electrical conductor disposed upon one of the vertical sidewalls. The array of memory cells further includes structure for coupling the active device regions to the substrate to reduce or eliminate a floating substrate effect.

U.S. Pat. No. 4,999,313 issued Mar. 12, 1991 to Arikawa et al. entitled PREPARATION OF A SEMICONDUCTOR ARTICLE USING AN AMORPHOUS SEED TO GROW SINGLE CRYSTAL SEMICONDUCTOR MATERIAL discloses a semiconductor article together with a process for producing the same which article has a plurality of semiconductor single crystal regions comprising a semiconductor single crystal region of one electroconductive type and a semiconductor single crystal region of the opposite electroconductive type on the same insulator substrate. At least the semiconductor single crystal region of one electroconductive type being provided by forming a different material which is sufficiently greater in nucleation density than the material of the insulator substrate and sufficiently fine to the extent that only one single nucleus of the semiconductor material can grow and then permitting the semiconductor material to grow around the single nucleus formed as the center.

U.S. Pat. No. 4,334,347 issued Jun. 15, 1982 to Goldsmith et al. and entitled METHOD OF FORMING AN IMPROVED GATE MEMBER FOR A GATE INJECTED FLOATING GATE MEMORY DEVICE discloses an improved gate injected, floating gate memory device having improved charge retention and endurance characteristics in which the barrier height for the injection of charge (electrons or holes) into the floating gate is reduced. This is accomplished by utilizing a layer of semi-insulating polycrystalline silicon between the control electrode and the insulating layer of the floating gate.

In a publication by Acovic et al. in the IBM Technical Disclosure Bulletin Vol. 34, No. 6 November 1991 pages 238–241 entitled VACUUM-SEALED SILICON-RICH-OXIDE EEPROM CELL an EEPROM cell is described using electron transport in a vacuum between silicon-rich-oxide injectors on the control and the floating gates. Since vacuum is used instead of $SiO_2$, the endurance and retention of the cell is very high, making it a candidate for a true non-volatile RAM cell. Use of SRO injectors and of vacuum allows the lowering of the programming voltages.

SUMMARY OF THE INVENTION

An object of the present invention is to provide an improved non-volatile random access semiconductor memory cell having dual control gates.

Another object of the present invention is to provide a dual gate non-volatile random access semiconductor memory cell fabricated on a silicon-on-insulator structure.

A further object of the present invention is to provide a non-volatile random access memory cell employing Fowler-Nordheim tunneling for program and erase or can employ channel hot carrier programming as well.

Still another object of the present invention is to provide a random access memory cell with Fowler-Nordheim tunneling including first and second control gates to permit lower voltage tunneling operation without disturbing adjacent cells.

DETAILED DESCRIPTION OF THE INVENTION

Figure 1:
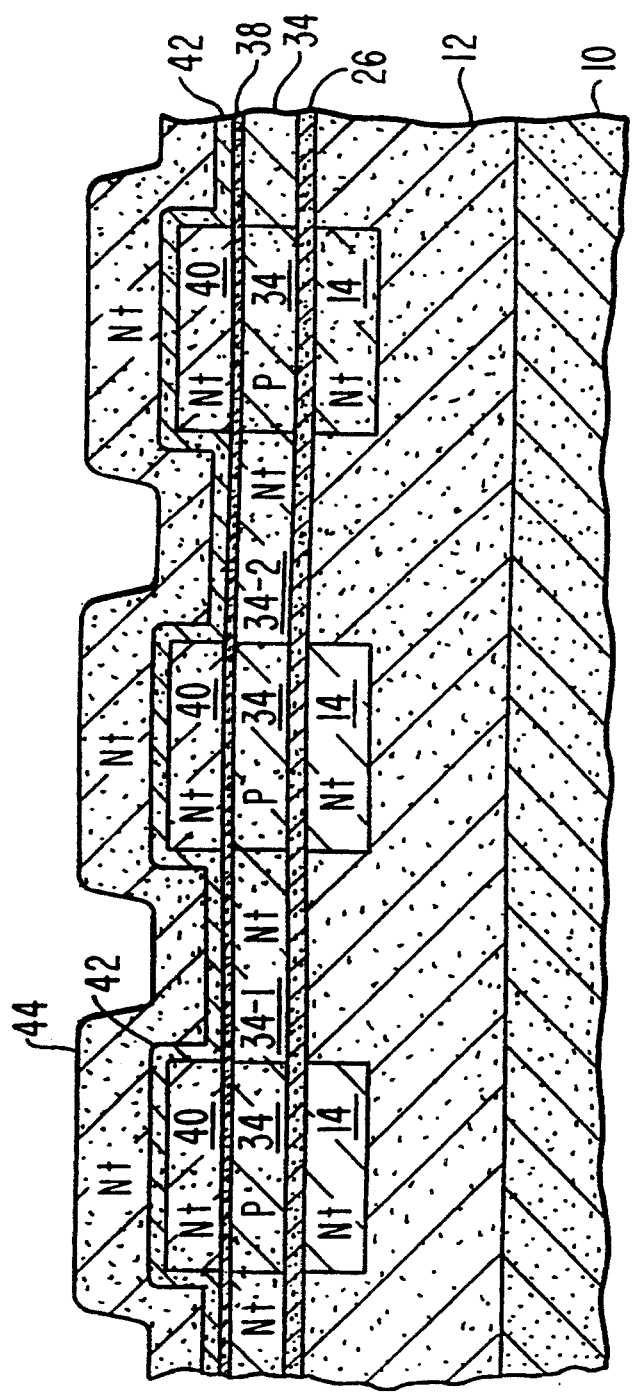
FIG. 1 is a cross-sectional elevation view of a dual control gate non-volatile random access semiconductor memory cell on silicon-on-insulator structure.

Referring to FIG. 1, a cross-sectional view of a non-volatile random access memory (NVRAM) cell is illustrated having dual control gates fabricated on a silicon-on-insulator (SOI) structure to enhance the erase function and avoid disturbance during program and erase modes, particularly when using Fowler-Nordheim tunneling.

Using the Fowler-Nordheim tunneling instead of channel hot carrier injection as programming mechanism for NVRAM cells can reduce power consumption and enhance the performance. However, in an array of stacked-gate NVRAM, using FN tunneling, programming one cell will usually disturb adjacent cells because of the high voltage required on the wordline (control gate) which extends continuously to the other cells. As a result, either all the cells under the selected word lines are programmed or the cells sharing the source/drain with the selected cell are also programmed. This drawback is known as "disturb".

Using Fowler-Nordheim tunneling as erase mechanism will introduce the same disturb problem. Although block erase is acceptable in the present NVRAM application. It is desirable for a NVRAM to have a selectively erase capability in the application of a solid state disk.

In the embodiment of the present invention shown in FIG. 1, the aforesaid disturb problem during program and erase using FN tunneling is overcome by the present invention of a stacked gate NVRAM cell built on SOI (layers 10, 12) structure having a second control gate (14) buried underneath the conducting channel of the cell.

Changing the voltage on the second control gate 14 will modulate the potential of the floating channel, which allows a specific cell to be selected and the programmed or erased by FN tunneling through the floating gate 40 and channel without disturbing adjacent cells. While reading the information stored in floating gate 40, the second control gate 14 can also be used to prevent disturb.

Alternatively, a P type silicon layer could be used instead of oxide layer 12.

The second control gate 14 is in parallel with the bit line (source/drain 34-1/34-2) and perpendicular with the word line 44 (the first control gate). The floating gate and the cell is located at the intersection (cross point) of the first and second control gates 14 and 44. Therefore, by varying the voltage on the first and second control gates 14 and 44 only, the cell can be programmed or erased through FN tunneling.

Figure 2:
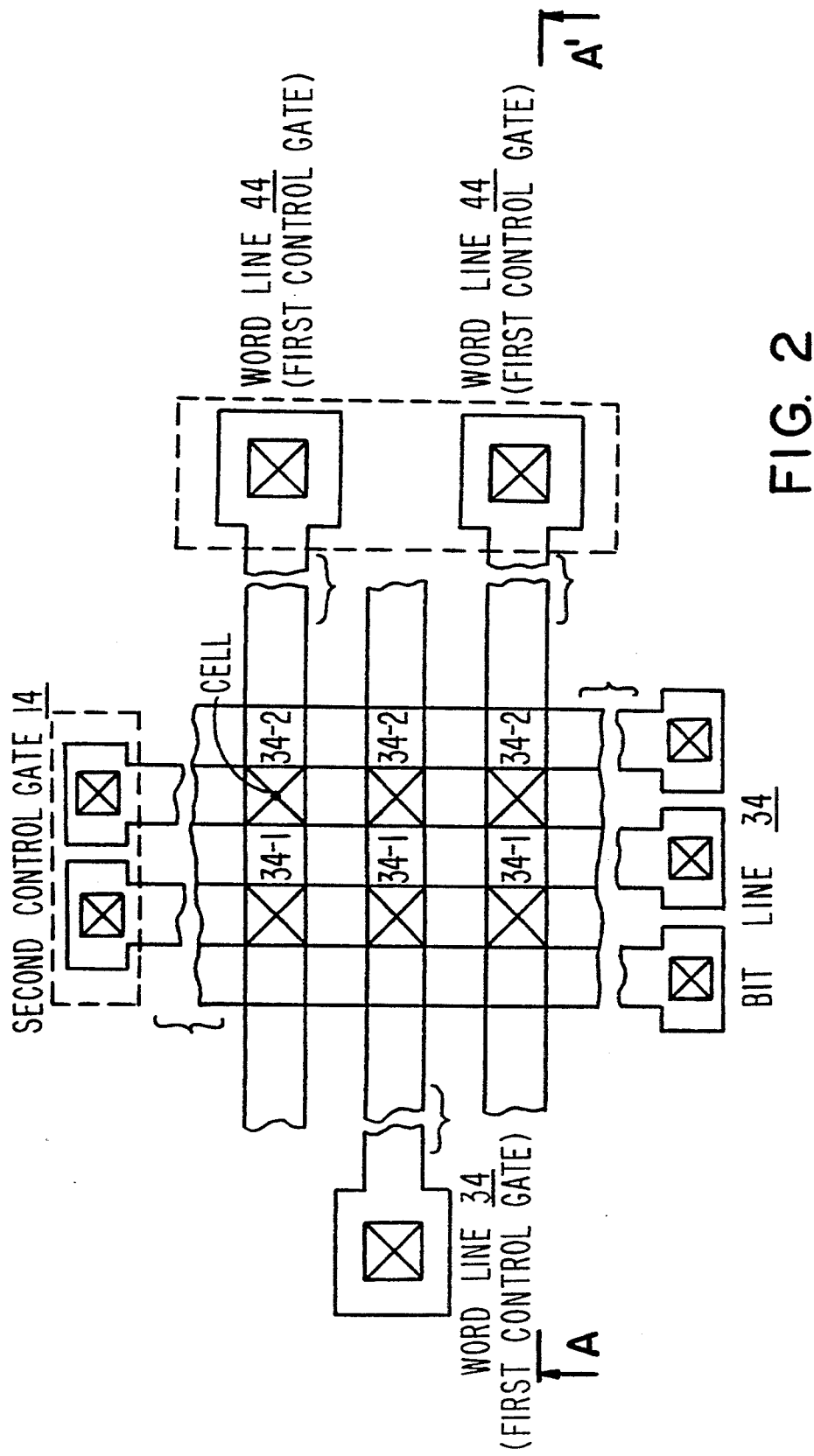
FIG. 2 is a plan view of the memory cell illustrated in FIG. 1.

More particularly, referring again to FIG. 1, a cross-sectional view of a non-volatile random access memory array is illustrated taken through the section AA' of the plan view illustration of the array shown in FIG. 2. The structure of FIG. 1 includes a layer of silicon 10 which is a substrate. A layer of oxide insulation 12 which may be 2,000 Angstroms thick, buried control gates 14 which may be 1,000 Angstroms thick, are located beneath thin oxide layer 26 and under the conducting channels 34, which may be 0.5 microns thick. Channels 34 are disposed between the source and drain regions 34-1 and 34-2.

A layer of gate oxide 38, for example 7 nm thick, is disposed over the source, drain and channels. Floating gates 40 are located on the gate oxide 38 and are covered with a layer of oxide/nitride/oxide (ONO) 42 having, for example, thicknesses of 5 nm for $SiO_2$, 5 nm for $Si_3N_4$ and 5 nm for $SiO_2$. A layer of doped polysilicon 44, for example 1,000 to 2,000 Angstroms thick, provides the word line control gates. Word line 44 will be referred to as the first control gate and buried gates 14 will be referred to as the second control gate.

Referring to FIG. 2, a plan view of the structure of FIG. 1 is illustrated showing the control gates 14 and 34 and the bit lines 26 of FIG. 1.

Figure 3:
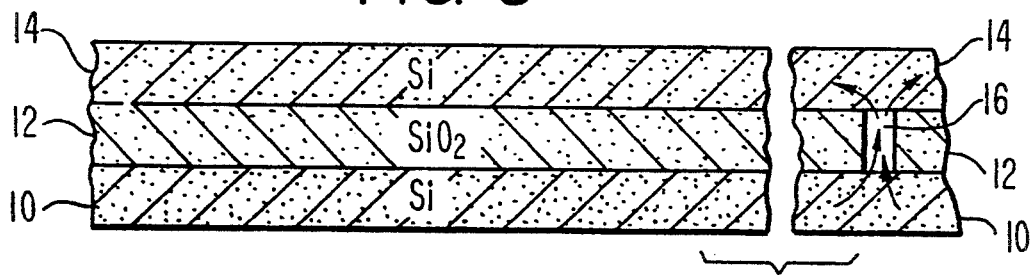
FIGS. 3 through 12 are cross-sectional elevation and plan views of the memory cell of FIGS. 1 and 2 at various stages in the fabrication process thereof.

Referring to FIGS. 3 through 10 cross-section views of the NVRAM are illustrated at different stages in the fabrication process therefore. In FIG. 3 a layer of silicon 10 is provided with a layer of silicon dioxide 12 disposed thereon. Using a process known in the art as silicon lateral overgrow (SLO) a second layer of silicon 14 is grown on the oxide layers 12. In the SLO process a hole 16 is opened in the oxide layers 12 and with proper temperature and pressure conditions, a layer of silicon 14 is grown (for example epitaxially) through hole 16 onto oxide layer 14 using silicon layer 10 as the seed. The hole 16 is opened away from the area where the device will be fabricated. If, as previously stated, P type silicon is used instead of oxide layer 12, the SLO process is unnecessary.

Alternatively, the structure of FIG. 3 may be replaced by a silicon-on-oxide structure consisting of an oxide layer (i.e. 12) and a silicon layer (i.e. 14) and N+ dopants are high energy implanted where required.

Still another alternative is to use the SIMOX process wherein oxygen is implanted to form buried oxide, and then annealed at 1300° C. for 20 hours.

Figure 4:
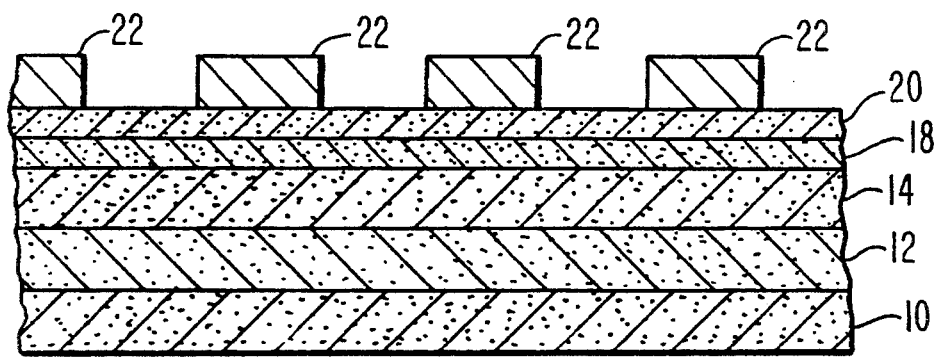
Figure 5:
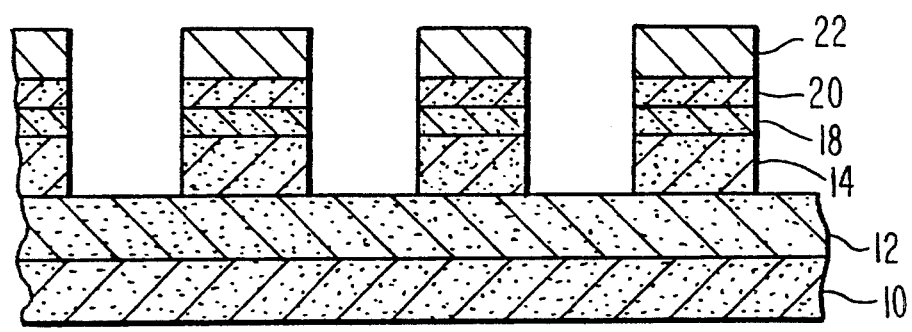

Using the structure of FIG. 3, a layer of oxide 18 and a layer of nitride 20, for example 20 nm thick, are disposed on silicon layers 14 as shown in FIG. 4. The upper nitride layer 20 is patterned with photoresist 22 that serves as an etch mask to etch holes through the nitride 20 and oxide 18 down to the silicon layers 14 as shown in FIG. 5.

Figure 6:
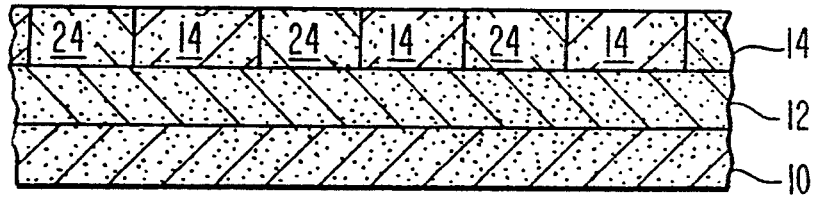

The photoresist is removed and the etched holes are filled with oxide 24 and the structure is polished using standard chemical-mechanical polishings to eliminate the nitride layers 20 and oxide layer 18, leaving a structure as shown in FIG. 6.

Figure 7:
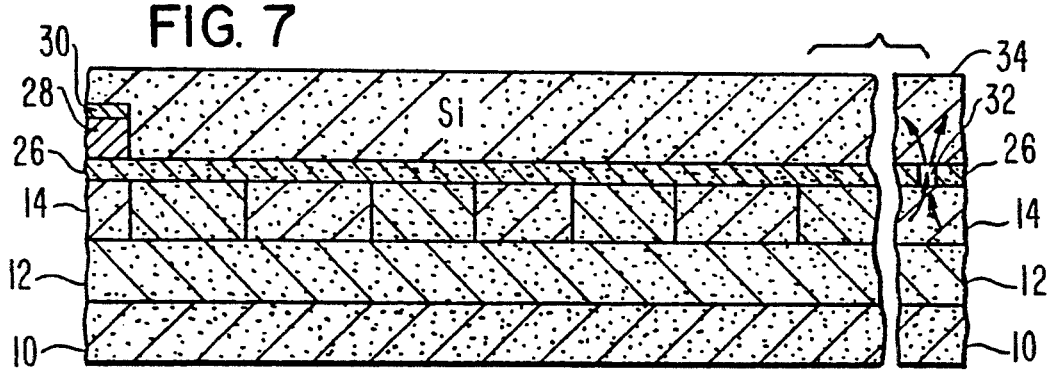

A layer of thin oxide 26, for example 10 nm thick, is deposited or grown over the structure as illustrated in FIG. 7. A local layer of nitride 28 and thick oxide 30 is formed on oxide layers 26 as shown in FIG. 7 to act as an polish stop. A hole 32 is opened in oxide layer 26 and the SLO process is repeated to form a layer of silicon 34 over oxide layer 26 with silicon 14 as the seed.

Figure 8:
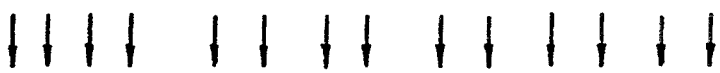
Figure 8:
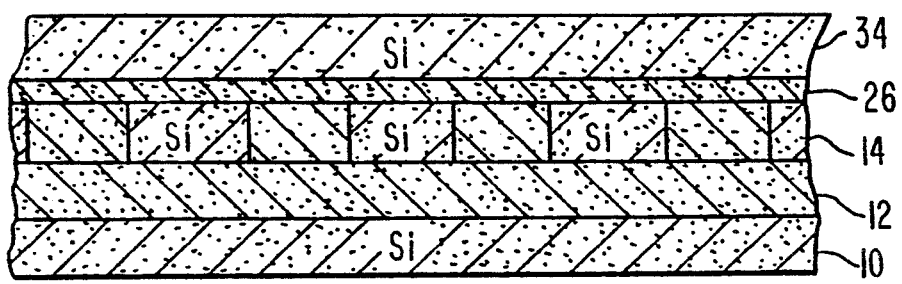

Using the nitride 28 and oxide 30 as a polish stop, the silicon layer 34 is polished down to the level of the oxide 30. The next step is ion implant P type dopant ($5 \times 10^{16}$) as channel doping as shown in FIG. 8.

Figure 9:
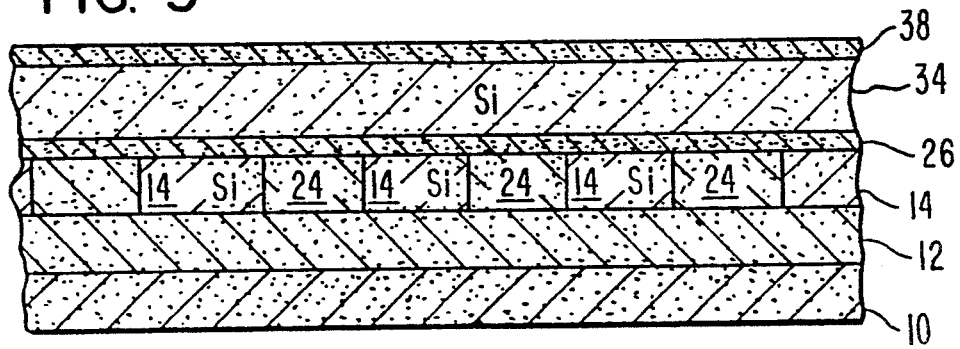
Figure 10:
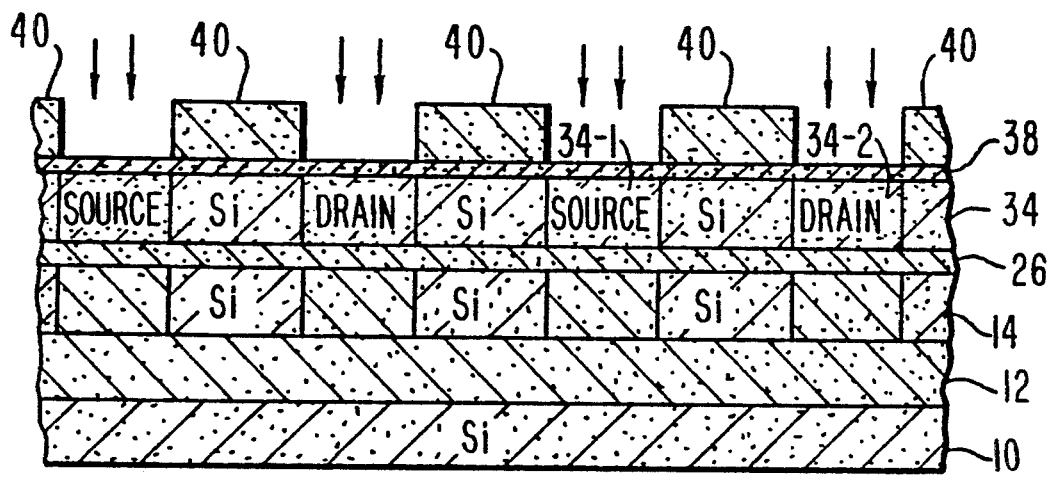
Figure 12:
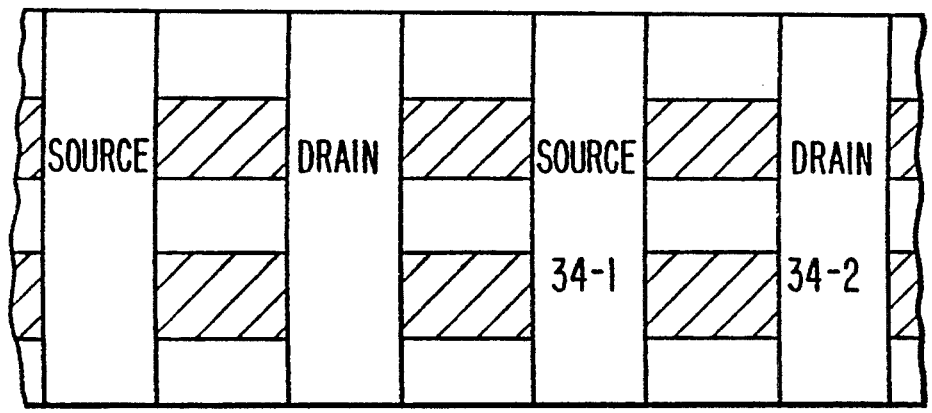
Figure 11:
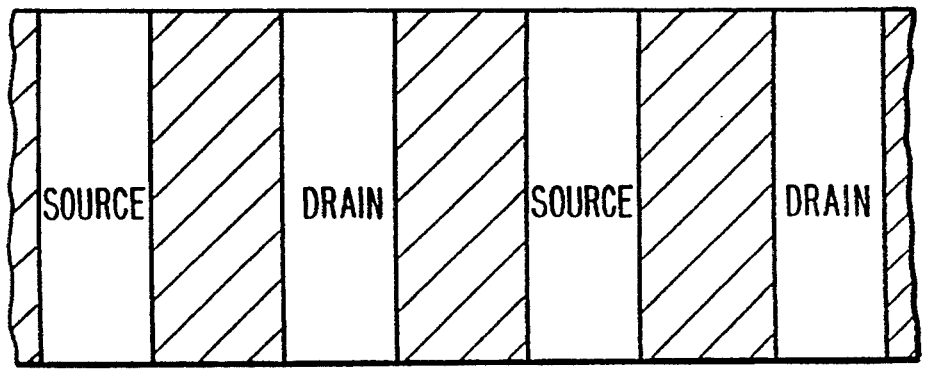

A layer of gate oxide 38, for example 7 nm thick; is then disposed over the structure as shown in FIG. 9. Referring to FIG. 1, next a layer of undoped polysilicon 40 is deposited over the structure of FIG. 9. The polysilicon layer 40 is patterned using lithographic techniques to form the channel regions 40. The polysilicon is first patterned in x-direction (FIG. 11) then ion implanted ($N+10^{20}$) for source, drain and floating gate at the same time. The polysilicon is then patterned in y-direction to form the floating gate (square) (FIG. 12). Then ion implanted (P-type $5 \times 10^{19}$) to form isolations between the source and drain.

A layer of ONO 42 is disposed over the polysilicon 40 and a layer of doped polysilicon 44 is deposited over the ONO layer 42, for example 5 nm of $SiO_2$, 10 nm of $Si_3N_4$ and 5 nm of $SiO_2$, to provide the wordline (control gate) 44 for the NVRAM.

Referring again to FIG. 1, it is seen that a second control gate 14 is provided. This permits the use of the desirable FN tunneling for program and erase without using high voltages. Because FN tunneling requires strong electric fields to accelerate the electrons across the oxide between the silicon regions in the past high voltages were used to provide the strong electric fields. These high voltages resulted in all the cells along the wordline becoming programmed and erased together because the wordline is continuous and conducts the high voltage. This condition is known as "disturb". In the embodiment of the present invention shown in FIG. 1, if a large voltage is required across the actual channel regions, voltage can be applied to both the first control gate (wordline) 44 and the second control gate 14. For example, if a voltage difference of 15 volts were needed for FN tunneling, in the past the wordline would be placed at 15 volts and a disturb condition would occur. Using the present invention a voltage of −10 volts is applied to second control gate 14 and a voltage of +5 volts is applied to wordline control gates 44 to provide the voltage difference of 15 volts without causing a disturb condition.

What has been described is a stacked gate NVRAM cell fabricated on SOI structure having a second control gate buried underneath the conducting channel of the cell. Applying and changing the voltage on the second control gate modulates the potential of the channel which permits a specific cell to be selected and then programmed or erased by FN tunneling through a floating gate and the channel without disturbing adjacent cells. While reading the information stored in the floating gate the second control gate can also be used to prevent disturb.

The second control gate is in parallel with the bit lines (source and chain) and perpendicular to the word line which is the first control gate. The floating gate and the cell are located at the intersection where the first and second control gates cross. Thus, by varying the voltage on the first and second control gates only, the cell can be programmed or erased through FN tunneling. However, the invention is not limited to FN tunneling applications and may also be employed with hot channel carrier injection.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A dual control-gate, random access memory cell for a memory array comprising:

a first layer of electrically insulating material;

a layer of semiconductor material overlying said first layer, said layer of semiconductor material containing adjacent source, channel and drain regions of an active device;

a floating gate element overlying said channel region of said layer of semiconductor material;

a first control gate element overlying said floating gate element and disposed parallel to said source and drain regions;

a discrete region of semiconductor material disposed in said first layer of electrically insulating material and underlying said channel region to provide a second control gate element disposed perpendicular to said first control gate element wherein said first control gate element, said floating gate element, said source, said channel and said drain regions and said second control gate element cooperate in combination to form a stacked, dual control gate memory cell for a random access memory array structure wherein said perpendicularly disposed first and second control gate elements are responsive to voltage for selectively reading, writing and erasing said memory cell.

2. A dual control-gate memory cell according to claim 1 wherein said layer of semiconductor material overlying said first layer is differentiated into discrete regions of alternate conductivity to provide said source, channel and drain regions, and wherein said memory cell structure further includes a layer of insulating material disposed between said layer of semiconductor material and said overlying floating gate element and a layer of insulating material disposed between said floating gate element and said overlying first control gate element.

3. A dual control gate memory cell according to claim 2 wherein said first control gate is a polysilicon wordline disposed in said memory array perpendicular to said second control gate of each memory cell.

* * * * *